United States Patent
Hayashida et al.

(10) Patent No.: US 7,307,326 B2
(45) Date of Patent: Dec. 11, 2007

(54) LIGHT RECEIVING ELEMENT AND LIGHT RECEIVING DEVICE INCORPORATING CIRCUIT AND OPTICAL DISK DRIVE

(75) Inventors: Shigeki Hayashida, Nara (JP); Tatsuya Morioka, Ikoma (JP); Yoshihiko Tani, Tenri (JP); Isamu Ohkubo, Kashiba (JP); Hideo Wada, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 187 days.

(21) Appl. No.: 10/499,357

(22) PCT Filed: Dec. 10, 2002

(86) PCT No.: PCT/JP02/12906

§ 371 (c)(1),
(2), (4) Date: Jun. 18, 2004

(87) PCT Pub. No.: WO03/054973

PCT Pub. Date: Jul. 3, 2003

(65) Prior Publication Data

US 2005/0116320 A1    Jun. 2, 2005

(30) Foreign Application Priority Data

Dec. 21, 2001 (JP) ............................. 2001-389189

(51) Int. Cl.
*H01L 31/00* (2006.01)
*H01L 31/0232* (2006.01)
(52) U.S. Cl. ........................ 257/432; 257/431
(58) Field of Classification Search ............ None See application file for complete search history.

(56) References Cited

U.S. PATENT DOCUMENTS 6,433,366 B1    8/2002  Takimoto et al.
6,830,951 B2 *  12/2004 Laurin et al. ............. 438/69

FOREIGN PATENT DOCUMENTS

| EP | 0223136 | * 10/1986 |
|---|---|---|
| JP | 63-151085 A | 6/1988 |
| JP | 64-50556 A | 2/1989 |
| JP | 1-248676 A | 10/1989 |
| JP | 2-284481 A | 11/1990 |
| JP | 2001-148503 A | 5/2001 |
| KR | 2001-30003 A | 4/2001 |

* cited by examiner

*Primary Examiner*—Kiesha Rose
(74) *Attorney, Agent, or Firm*—Birch, Stewart, Kolasch & Birch, LLP

(57) ABSTRACT

A light receiving device includes a silicon substrate, a first P type diffusion layer on the silicon substrate, and a P type semiconductor layer on the P type diffusion layer. On a surface part of the P type semiconductor layer, two N type diffusion layers as light receiving parts, and a second P type diffusion layer between the two N type diffusion layers are provided. On the P type semiconductor layer, an antireflection film structure composed of a first silicon oxide formed by thermal oxidation and a second silicon oxide formed by CVD is provided. A film thickness of the first silicon oxide is set at about 15 nm, thus a defect in a interface between the first silicon oxide and the P type semiconductor layer is prevented. A film thickness of the second silicon oxide is set at about 100 nm, thus a leak current between cathodes is prevented when a power supply voltage is applied for long period of time.

7 Claims, 11 Drawing Sheets

LEAK CURRENT BETWEEN CATHODES WITH ELAPSED
TIME AFTER APPLICATION OF POWER SUPPLY VOLTAGE

CHANGES IN CURRENT BETWEEN CATHODES AS REVERSE BIAS VOLTAGE OF LIGHT RECEIVING ELEMENT IS CHANGED

RELATED ART

LEAK CURRENT BETWEEN CATHODES WITH ELAPSED
TIME AFTER APPLICATION OF POWER SUPPLY VOLTAGE

RELATED ART

RELATED ART

RELATED ART

LIGHT RECEIVING ELEMENT AND LIGHT RECEIVING DEVICE INCORPORATING CIRCUIT AND OPTICAL DISK DRIVE

This Nonprovisional application claims priority under 35 U.S.C. § 119(a) on Patent Application No. P2001-389189 filed in Japan on Dec. 21, 2001, the entire contents of which are hereby incorporated by reference.

TECHNICAL FIELD

The present invention relates to a light receiving device, a light receiving unit incorporating a circuit, and an optical disk drive.

BACKGROUND ART

Conventionally, an optical pickup for use in optical disk drives is structured such that a light emitted from a semiconductor laser is collected with a lens and radiated onto an optical disk, and the light reflected by the optical disk with optical power modulated by a pit indicating a signal is received by a light receiving device. An electric signal from the light receiving device is processed in a signal processing circuit, and a data signal written onto the optical disk is detected, as well as a focus signal for controlling a focus of the lens and a servo signal for controlling a light collecting position on the optical disk are detected. As the light receiving device, a so-called split type light receiving device composed of a plurality of light receiving parts is employed for detecting the data signal, the focus signal and the servo signal.

In recent years, optical disk drives using a blue semiconductor laser as a substitute for infrared and red semiconductor lasers are being developed to support higher density data that are written onto the optical disk. The split type light receiving device for use in such optical disk drive includes a conventional one shown in FIGS. 7A and 7B (Japanese unexamined patent application No. 2001-148503). FIG. 7A is a plan view showing a split type light receiving device while FIG. 7B is a cross sectional view taken along the arrow line D—D' of FIG. 7A. The split type light receiving device is structured such that a plurality of N type diffusion layers 601, 601 as cathodes are provided on a P type semiconductor layer 600 to form light receiving parts. On the surface of the light receiving device on the side of the light receiving parts, two films composed of a silicon oxide 604 and a silicon nitride 605 are disposed to constitute an antireflection film structure 603.

The antireflection film structure 603 composed of the silicon oxide 604 and the silicon nitride 605 effectively reduces the reflectance of incident light by appropriately selecting each film thickness according to the wavelength of the incident light. Generally, combining a plurality of films different in kind as shown above makes it possible to obtain an antireflection film with a relatively small thickness and low reflectance. For example, in the case of red light with wavelength of 650 nm, the film thickness of the silicon oxide is set at 50 nm while the film thickness of the silicon nitride is set at 30 nm, so that the reflectance in the antireflection film structure 603 can reach almost 4%. Further, in the case of blue light with wavelength of 400 nm, the film thickness of the silicon oxide is set at 10 nm while the film thickness of the silicon nitride is set at 39 nm, so that the reflectance in the antireflection film structure 603 can reach almost 0%.

Further, in the vicinity of the surface of the P type semiconductor layer 600 and between a plurality of the light receiving parts, a P type diffusion layer 602 with impurity concentration of about 1E18 $cm^{-3}$ to 1E19 $cm^{-3}$ is disposed so as to prevent leak current between cathodes caused by positive charges that are stored in the interface between the silicon oxide 604 and the silicon nitride 605 and in the silicon nitride 605 of the antireflection film structure 603.

However, the above-stated conventional light receiving device has a problem that leak current between cathodes caused by positive charges stored on the surface of the silicon nitride 605 cannot be prevented. More specifically, during a reliability test and the like after the light receiving device is produced, if a power supply voltage is applied to the cathode of the light receiving device for a long time, then electric charges present in the silicon nitride 605 of the antireflection film structure 603 are redistributed by Pool-Frenkel current. Moreover, electric charges influenced by static charges and contamination are stored on the surface of the silicon nitride 605. Leak current flows between cathodes by these electric charges. FIG. 8 is a graph showing changes in leak current between cathodes as a reverse bias voltage of the light receiving device is changed, where the horizontal axis represents a reverse bias voltage (V) as a power supply voltage applied to the light receiving device, and the vertical axis represents current (A) between cathodes. Further as shown in FIG. 9, corresponding to the length of a period of time during which the supply voltage is applied, the leak current between cathodes is increased. In FIG. 9, the horizontal axis represents elapsed time (hour) after the reverse bias voltage is applied, while the vertical axis represents leak current (A) between cathodes.

The reason why the leak current flows between cathodes will be described with reference to schematic views shown in FIG. 10 and FIG. 11. FIG. 10 is a schematic cross sectional view showing the light receiving device of FIG. 7B after a long-time reliability test is carried out. As shown in FIG. 10, positive charges 610 are stored on the surface of the antireflection film structure 603, and the stored positive charges 610 generate inversion charges 611 in the vicinity of the surface of the P type semiconductor layer 600 and between the N type diffusion layers 601, 601. FIGS. 11A and 11B are views showing redistribution of electric charges caused by Pool-Frenkel current in the light receiving device of FIG. 7B. First, as shown in FIG. 11A, during a production process of the light receiving device, the silicon nitride 605 is damaged by plasma or the light receiving device is formed into a chip for a wire bonding step performed after production of the light receiving device, by which positive charges 612 and negative charges 613 are generated in the silicon nitride 605. Then, when a voltage is applied to the N type diffusion layers 601, 601 during a reliability test, the positive charges 612 in the silicon nitride 605 are accumulated in the across-the-width center of the silicon nitride 605 as shown in FIG. 11B, and these positive charges 612 generate inversion charges 614 in a portion of the P type semiconductor layer 600 between the N type diffusion layers 601, 601. Here, the voltage applied to the N type diffusion layers 601, 601, i.e., a reverse bias voltage of the cathode, generates a repulsive force in the silicon nitride 605, as a result of which a number of positive charges 612 are concentrated in a region of the silicon nitride 605 corresponding to a portion between the cathodes.

As shown in FIG. 10 and FIG. 11, the generated inversion charges 611, 614 are also generated in the P type diffusion layer 602 positioned between the N type diffusion layers 601, 601. These inversion charges 611, 614 cause leak current flowing between the N type diffusion layers 601, 601.

For preventing the current from flowing between the cathodes, it is necessary to decrease an inversion voltage generated by the positive charges, which is considered to be fulfilled by either increasing the impurity concentration of the P type diffusion layer 602, or increasing the thickness of the antireflection film structure 603. However, if the impurity concentration of the P type diffusion layer 602 is increased, then carriers generated upon light reception tend to recombine, resulting in degraded sensitivity of the light receiving device. If the thickness of the silicon nitride 605 is increased for increasing the thickness of the antireflection film structure 603, stress is generated in this silicon nitride 605, and the stress heightens an interface state between the P type semiconductor layer 600 and the silicon oxide 604, resulting in degradation of light receiving sensitivity. Moreover, if the thickness of the silicon oxide 604 is increased, the interface state between the P type semiconductor layer 600 and the silicon oxide 604 is heightened, causing degradation of the sensitivity of the light receiving device. Therefore, the film thickness of the silicon oxide 604 should be about 300 nm or less while the film thickness of the silicon nitride 605 should be about 50 nm or less. However, these film thicknesses cannot prevent leak current after application of the supply voltage.

Accordingly, an aspect of the present invention is a light receiving device which causes almost no leak current even after continual operation for a long time and which is free from degradation of sensitivity.

SUMMARY OF THE INVENTION

In preferred embodiments of the present invention a light receiving device comprises:
- a plurality of light receiving parts on a semiconductor layer; and
- a first light transmitting film and a second light transmitting film which are laminated at least on the plurality of light receiving parts and on parts between the plurality of light receiving parts in an order from a side closer to the light receiving parts, wherein
- both the first light transmitting film and the second light transmitting film are oxides, and
- the second light transmitting film is larger in thickness than the first light transmitting film.

According to the above configuration, both the first light transmitting film and the second light transmitting film are oxides, so that even if the thickness of the second light transmitting film is relatively larger, a stress generated in the second light transmitting film is smaller than that in the case where the nitride oxide has a larger thickness as seen in the conventional case. Therefore, a stress generated in the semiconductor layer having the light receiving parts is smaller than the conventional case. As a result, the interface state between the first light transmitting film and the semiconductor layer is smaller than the conventional case. Further, the first light transmitting film is smaller in thickness than the second light transmitting film, so that the interface state between the first light transmitting film and the semiconductor layer having the light receiving parts is relatively small. Moreover, setting the total thickness of the first light transmitting film and the thickness of the second light transmitting film to be relatively large enables leak current between the light receiving parts caused by electric charges stored on the surface of the second light transmitting film to be prevented. Further, since a silicon nitride is not used in the second light transmitting film, redistribution of electric charges due to, for example, Pool-Frenkel current as seen in the conventional case does not occur in the second light transmitting film, which prevents leak current between the light receiving parts caused by redistribution of the electric charges in this second light transmitting film. Thus the light receiving device is capable of preventing leak current between the light receiving parts, and stably achieving excellent capability free from almost any degradation of sensitivity.

Here, for example, by setting the thickness of the first light transmitting film and the second light transmitting film at $\lambda/4N(2M+1)$nm, where $\lambda$(nm) is wavelength of incident light, N is an index of refraction of each of the first and second light transmitting films, and M is an integer, degradation of the sensitivity of the light receiving device may be effectively prevented.

Here, the second light transmitting film may be disposed directly or indirectly on the first light transmitting film.

In one embodiment, the first light transmitting film is a silicon oxide formed by thermal oxidation method, and the second light transmitting film is a silicon oxide formed by deposition method.

According to the above embodiment, the first light transmitting film with a relatively small thickness is formed by thermal oxidation method, which makes it possible to reduce defect generated on the interface between the first light transmitting film and the semiconductor layer having the light receiving parts. This makes it possible to prevent degradation of the sensitivity of the light receiving device caused by the defect of the interface. Further, the second light transmitting film with a relatively large thickness is formed by deposition method, which makes it possible to make a stress generated between the second light transmitting film and the first light transmitting film relatively small. Therefore, in the interface between the first light transmitting film and the semiconductor layer, the interface state caused by the stress may be lowered. This makes it possible to obtain the light receiving device with smaller leakage between cathodes as seen in the conventional case and with excellent sensitivity.

Here, the deposition method refers to CVD (Chemical Vapor Deposition), PVD (Physical Vapor Deposition), liquid-phase growth, vapor deposition, and sputtering.

In one embodiment, the light receiving device further comprises a third light transmitting film disposed between the first light transmitting film and the second light transmitting film.

According to the above embodiment, the third light transmitting film is disposed between the first light transmitting film and the second light transmitting film, which makes it possible to reduce the stress by the second light transmitting film. Therefore, the interface state caused by the stress on the interface can be lowered, and so the sensitivity of the light receiving device in the present embodiment can be further increased.

In one embodiment, the third light transmitting film is a silicon nitride.

According to the above embodiment, the third light transmitting film is a silicon nitride, so that the stress by the second light transmitting film is effectively reduced, and the sensitivity of the light receiving device in the present invention is effectively increased. Further, the silicon nitride that is the third light transmitting film is covered with the second light transmitting film, so that the silicon nitride is not exposed during the production process or in the wire bonding step. Therefore, since almost no electric charges are stored in the silicon nitride, leak current between the light receiving parts caused by redistribution of electric charges due to, for example, Pool-Frenkel current is effectively prevented.

Furthermore, a light receiving unit incorporating a circuit of the present invention comprises:

the aforementioned light receiving device; and a signal processing circuit for processing a signal from light receiving parts of the light receiving device, wherein the light receiving device and the signal processing circuit are formed on the semiconductor layer.

According to the above configuration, the light receiving device and the signal processing circuit are formed in a monolithic state, which makes it possible to provide a small-size light receiving unit incorporating a circuit with smaller leak current as well as excellent sensitivity.

Furthermore, an optical disk drive of the present invention comprises the aforementioned light receiving device or the aforementioned light receiving unit incorporating a circuit.

According to the above configuration, the small-size light receiving device or the small-size light receiving unit incorporating a circuit with smaller leak current as well as excellent sensitivity is provided, which makes it possible to provide an optical disk drive with stable operation capable of, for example, reading and writing mass-storage data at high speed.

BRIEF DESCRIPTION OF THE DRAWINGS

FIG. 1A is a plan view showing a light receiving device in a first embodiment of the present invention, while

FIG. 3A is a plan view showing a light receiving device in a second embodiment of the present invention, while

FIG. 4A is a plan view showing a light receiving device in a third embodiment of the present invention, while

FIG. 7A is a plan view showing a conventional light receiving device, while

FIG. 11A is a cross sectional view showing the state before the reliability test, while FIG. 11B is a cross sectional view showing the state after the reliability test.

DETAILED DESCRIPTION OF THE INVENTION

Embodiments of the invention will now be described in detail with reference to the accompanying drawings.

(The First Embodiment)

Figure 1A:
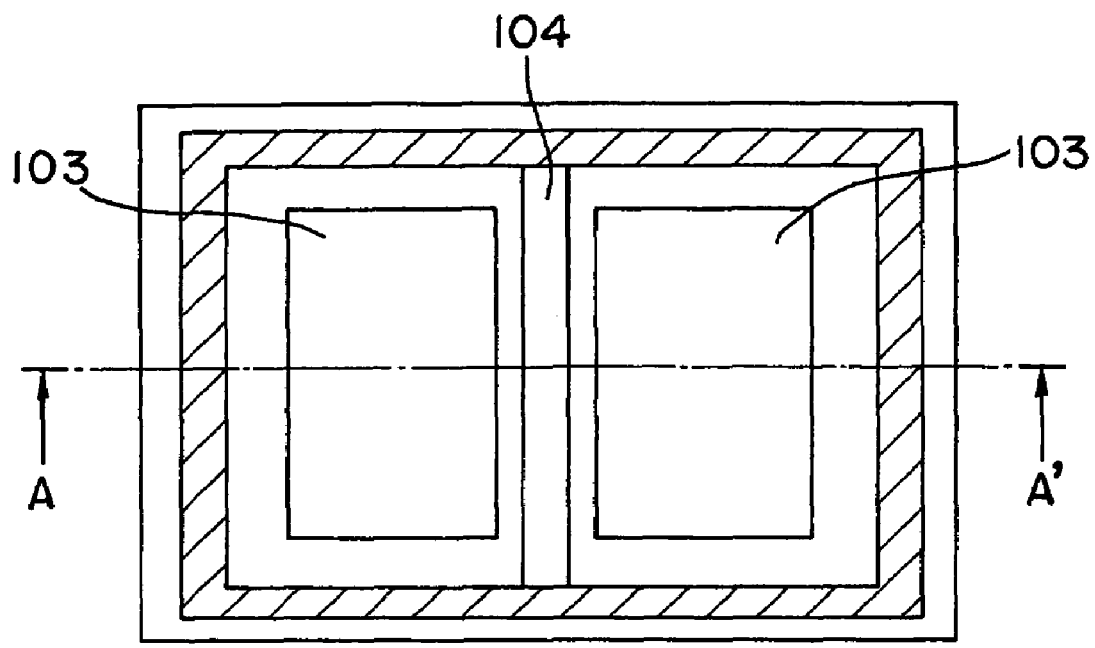
Figure 1B:
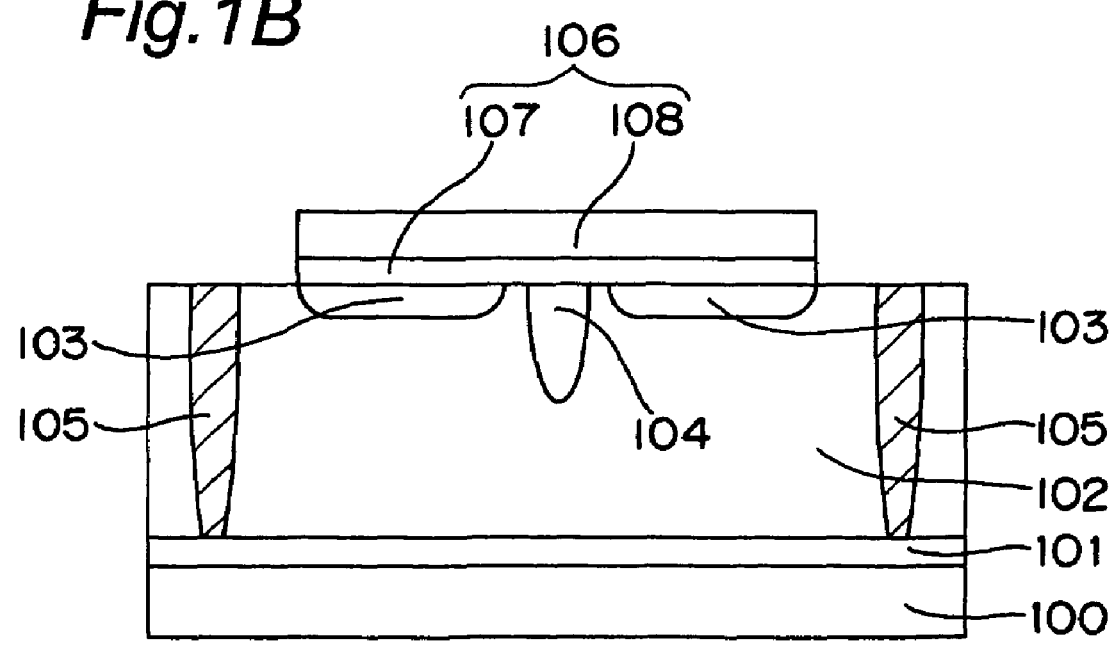
FIG. 1B is a cross sectional view taken along the arrow line A–A' of FIG. 1A.

FIG. 1A and 1B are views of a light receiving device in the first embodiment of the present invention. FIG. 1A is a plan view showing the light receiving device while FIG. 1B is a cross sectional view taken along the arrow line A–A' of FIG. 1A. This light receiving device is a split type light receiving device having a plurality of light receiving parts. In this embodiment, contacts, metal interconnections, interlayer insulating films and the like that are formed after a contact step are deleted.

The light receiving device includes a silicon substrate 100, a first P type diffusion layer 101 with impurity concentration of about $1E18$ $cm^{-3}$ and a thickness of about 1 μm on the silicon substrate 100, and a P type semiconductor layer 102 with impurity concentration of about $1E13$ to $1E16$ $cm^{-3}$ and a thickness of about 10 μm to 20 μm on the P type diffusion layer 101. On the surface part of the P type semiconductor layer 102, two N type diffusion layers 103 and 103 with impurity concentration of about $1E17$ to $1E20$ $cm^{-3}$ in the vicinity of the surface and a junction depth of about 0.2 μm to 1.5 μm are formed to constitute a plurality of light receiving parts. An impurity forming the N type diffusion layers 103 may be any element such as arsenic, phosphorus, and antimony as long as it is pentavalent. It is to be noted that the number of the N type diffusion layers 103 may be two or more.

In the surface part of the P type semiconductor layer 102 and between the two N type diffusion layers 103 and 103, a second P type diffusion layer 104 is provided. In the second P type diffusion layer 104, there is diffused an impurity with such concentration that allows restrain of leak current between a plurality of the N type diffusion layers 103 when a power supply voltage is continuously applied for a long time, and allows sufficient securement of the sensitivity of the light receiving parts. More specifically, the second P type diffusion layer 104 has impurity concentration of about $1E17$ $cm^{-3}$. Further, on the both left-hand and right-hand side of the P type semiconductor layer 102 in FIG. 1B, there are shown parts of a third P type diffusion layer 105 extending from the top surface of the P type semiconductor layer 102 to the P type diffusion layer 101 for taking a contact between the top surface of the P type semiconductor layer 102 and the P type diffusion layer 101. It is to be noted that impurities forming the first to the third P type diffusion layers 101, 104 and 105 may be any elements such as boron and indium as long as the elements are triatomic.

Further, on the P type semiconductor layer 102, and on the N type diffusion layers 103 as well as on a part between these two N type diffusion layers 103, 103, there is provided an antireflection film structure 106. The antireflection film structure 106 is composed of a first silicon oxide 107 and a second silicon oxide 108 laminated in the order from the side closer to the light receiving parts. The first silicon oxide 107 is an oxide formed by thermal oxidation, whereas the second silicon oxide 108 is an oxide formed by CVD. The oxide formed by CVD is lower in density than the oxide formed by thermal oxidation, whereas the oxide formed by CVD is larger in etching rate than the oxide formed by thermal oxidation. The total film thickness of the first silicon oxide 107 and the second silicon oxide 108, i.e., the thickness of the antireflection film structure 106, should be set such that an inversion voltage specified by the total thickness and the impurity concentration of the second P type diffusion layer 104 is not smaller than the power supply voltage of the light receiving device. The inversion voltage is expressed in the following formula under an ideal condition;

$$V_{th} = \sqrt{2\epsilon_{si}\epsilon_0 q N_a (2\varnothing_b)}/\epsilon_{ox}\epsilon_0/t_{ox}) + 2\varnothing_b \qquad (1)$$

where "$\epsilon_{si}$" denotes a relative permittivity of the silicon, "$\epsilon_0$" denotes a space permittivity, "q" is an elementary charge quantity, "$N_a$" denotes an impurity concentration on the surface of the layer with an antireflection film structure formed on the surface, "$\varnothing_b$" denotes a difference between Fermi level and intrinsic Fermi level in the layer with an antireflection film structure formed on the surface, "$\epsilon_{ox}$" denotes a relative permittivity of the antireflection film structure, and "$t_{ox}$" is the thickness of the antireflection film structure.

Figure 2:
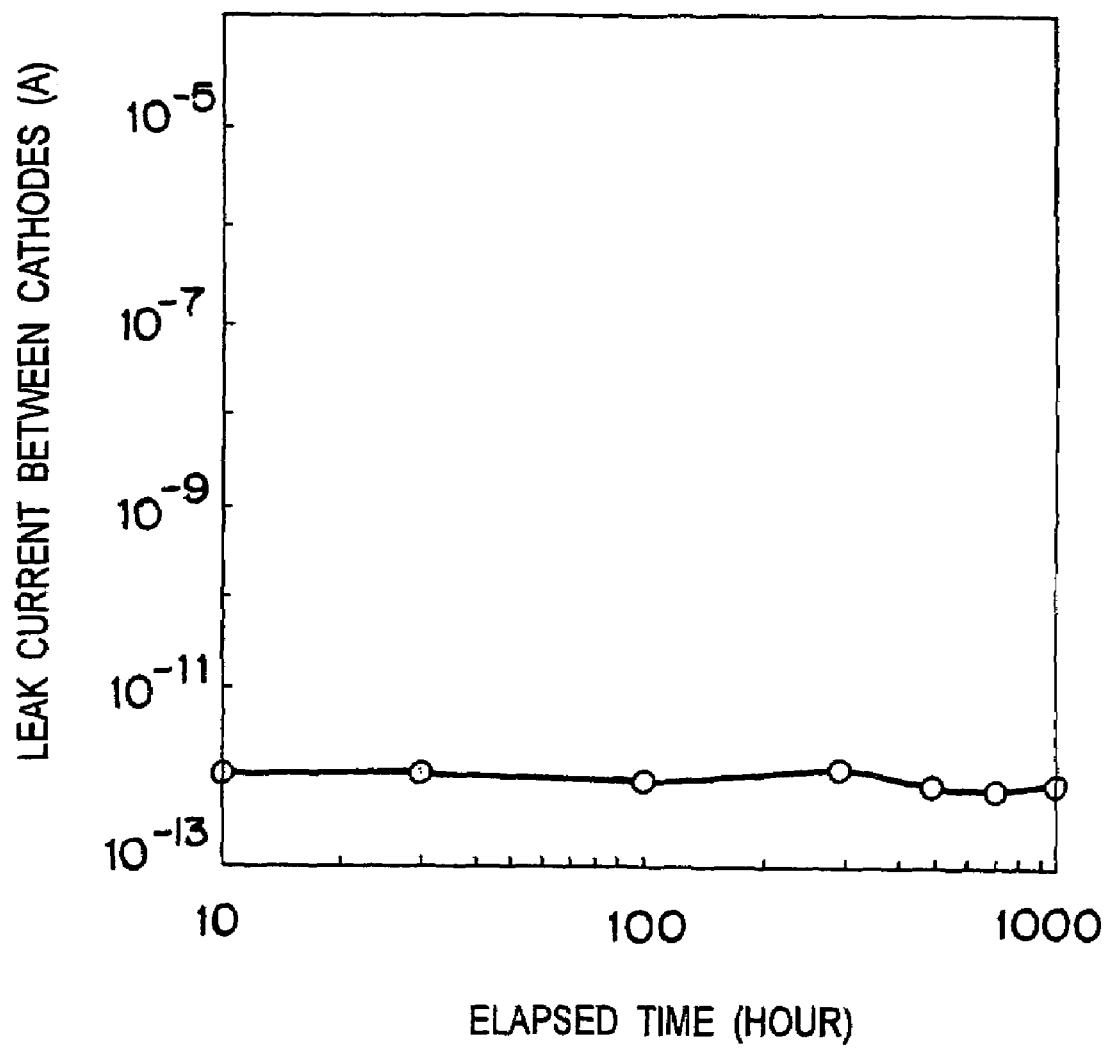
FIG. 2 is a graph showing leak current flowing between cathodes when a power supply voltage is applied for 1000 hours to the light receiving device in the first embodiment.

In the above formula (1), setting the inversion voltage $V_{th}$ at not smaller than 6V makes it possible to prevent inversion of electric charges in a region directly under the antireflection film structure 106. In the case where the impurity concentration $N_a$ in the above formula (1) is set to be the impurity concentration of the P type diffusion layer 104 in the present embodiment, it is necessary to set $t_{ox}$ of the thickness of the antireflection film structure 106 at 110 nm to 120 nm or larger. Further, in order to prevent defect from being generated in the interface between the P type semiconductor layer 102 and the first silicon oxide 107 formed by thermal oxidation, it is necessary to set the film thickness of the first silicon oxide 107 at about 30 nm or lower. Therefore, it is necessary to form the first silicon oxide 107 thinner than the second silicon oxide 108. In the present embodiment, the film thickness of the first silicon oxide 107 is set at about 15 nm, while the film thickness of the second silicon oxide 108 is set at about 100 nm. In this case, a value of inversion voltage specified by the impurity concentration of the second P type diffusion layer 104 and the thickness of the antireflection film structure 106 is about 6.5 V or larger. Therefore, even if a power supply voltage of 6V is continuously applied for a long time, leak current caused by the inversion charges stored on the surface part of the second P type diffusion layer 104 does not flow between the two N type diffusion layers 103. FIG. 2 is a view showing the result of measurement of leak current flowing between the two N type diffusion layers 103, i.e., between the cathodes of the light receiving device, when a power supply voltage is applied to the light receiving device of FIGS. 1A and 1B for 1000 hours. In FIG. 2, the horizontal axis represents elapsed time (hour) after the power supply voltage is applied, while the vertical axis represents leak current (A) between the cathodes. As shown in FIG. 2, in the light receiving device, leak current hardly flows between the cathodes even after the power supply voltage is applied for 100 hours. Further, since the film thickness of the first silicon oxide 107 is set at about 30 nm or smaller, defect is not generated in the interface between the P type semiconductor layer 102 and the first silicon oxide 107 and therefore the sensitivity of the light receiving device is not degraded due to the interface state caused by defect. Therefore, the light receiving device in the present embodiment makes it possible to stably reduce leak current and to achieve excellent sensitivity.

In the above embodiment, the thickness of the first silicon oxide 107 and the second silicon oxide 108 constituting the antireflection film structure 106 should be such that the first silicon oxide 107 is thinner than the second silicon oxide 108 and defect is not generated in the interface between the first silicon oxide 107 and the P type semiconductor layer 102.

The impurity concentration of the second P type diffusion layer 104 should be such that the inversion voltage is larger than the power supply voltage under the thickness of the antireflection film structure 106.

Further, the present invention is not limited to the configuration of the split type light receiving device disclosed in the above embodiment, and so is applicable to light receiving devices with various configurations. For example, as long as leak current between cathodes immediately after production or during a reliability test is sufficiently restrained, the P type diffusion layer 104 may have other concentration, or the P type diffusion layer 104 may be deleted.

Further, in the above embodiment, it is acceptable to change P type to N type and N type to P type in the configuration. Moreover, the form of the light receiving parts is not limited to the form shown in FIG. 1A and therefore other forms are applicable. Also, the silicon substrate 100 may be other semiconductor substrates. Furthermore, the power supply voltage of the light receiving device is not limited to the voltage value disclosed in the present embodiment.

Further in the above embodiment, although the second silicon oxide 108 is formed by CVD, it may be formed by any other methods as PVD, liquid-phase growth, vapor deposition and sputtering, except the thermal oxidation.

(The Second Embodiment)

Figure 3A:
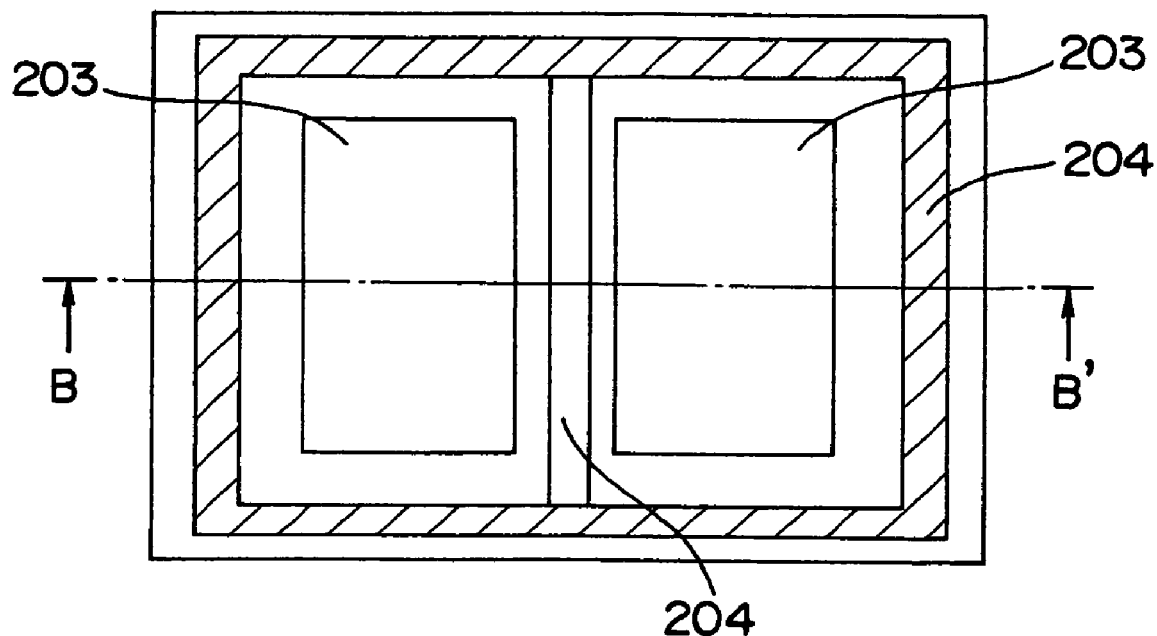
Figure 3B:
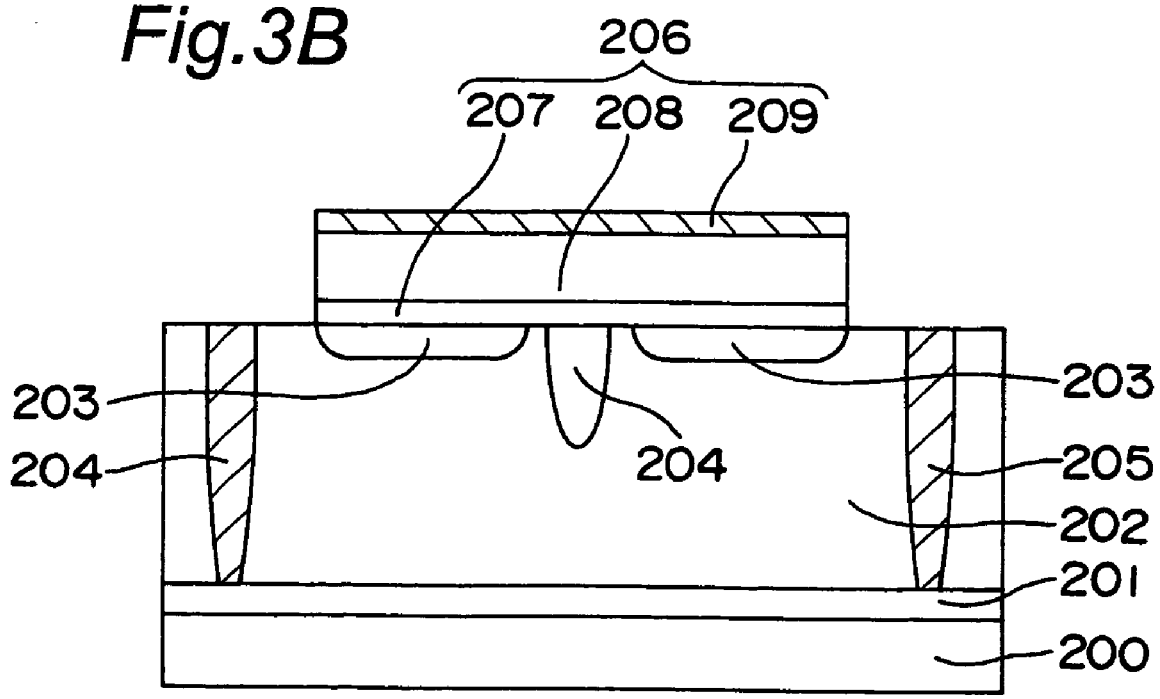
FIG. 3B is a cross sectional view taken along the arrow line B–B' of FIG. 3A.

FIG. 3A is a plan view showing a light receiving device in the second embodiment of the present invention, while FIG. 3B is a cross sectional view taken along the arrow line B–B' of FIG. 3A. In this embodiment, contacts, metal interconnections, interlayer insulating films and the like that are formed after a contact step are deleted.

The light receiving device of the present embodiment includes a silicon substrate 200, a first P type diffusion layer 201 with impurity concentration of about 1E18 cm$^{-3}$ and a thickness of about 1 μm on the silicon substrate 200, and a P type semiconductor layer 202 with impurity concentration of about 1E13 to 1E16 cm$^{-3}$ and a thickness of about 10 μm to 20 μm. On the surface part of the P type semiconductor layer 202, two N type diffusion layers 203 and 203 with impurity concentration of about 1E17 to 1E20 cm$^{-3}$ in the vicinity of the top surface and a junction depth of about 0.2 μm to 1.5 μm are formed to constitute two light receiving parts. The light receiving device is a so-called split type light receiving device having a plurality of light receiving parts. An impurity forming the N type diffusion layers 203 may be any element such as arsenic, phosphorus, and antimony as long as the element is pentavalent. It is to be noted that the number of the N type diffusion layers 203 may be two or more.

In the surface part of the P type semiconductor layer 202 and between the two N type diffusion layers 203 and 203, a second P type diffusion layer 204 is provided, and the second P type diffusion layer 204 has impurity concentration of about 1E17 cm$^{-3}$ like the first embodiment. Further, on the both left-hand and right-hand sides of the P type semiconductor layer 202 in FIG. 3B, there are shown parts of a third P type diffusion layer 205 from the top surface of the P type semiconductor layer 202 to the first P type diffusion layer 201 for taking a contact. It is to be noted that impurities forming the first to the third P type diffusion layers 201, 204 and 205 may be any elements such as boron and indium as long as the elements are triatomic.

Further, on the P type semiconductor layer 202, and on the N type diffusion layers 203 as well as on a part between the two N type diffusion layers 203 and 203, there is provided an antireflection film structure 206. The antireflection film structure 206 is composed of a first silicon oxide 207, a second silicon oxide 208, and a silicon nitride 209, laminated in the order from the side closer to the light receiving parts. The first silicon oxide 207 is an oxide formed by thermal oxidation, whereas the second silicon oxide 208 is an oxide formed by CVD. The entire thickness of the antireflection film structure 206 should be set such that an inversion voltage specified by the entire thickness and the impurity concentration of the second P type diffusion layer 204 is not smaller than the power supply voltage of the light receiving device. More specifically, in the case where the power supply voltage is 6V, it is necessary to set the entire thickness of the antireflection film structure 206 at not smaller than 110 nm. Herein, to prevent defect from being generated in the interface between the first silicon oxide 207 formed by thermal oxidation and the P type semiconductor layer 202, the film thickness of the first silicon oxide 207 is set at not larger than 30 nm. Also, forming the silicon nitride 209 with a larger thickness increases the stress of the second silicon oxide 208, and therefore the thickness of the silicon nitride 209 should preferably be set at as small as possible, specifically at not larger than 50 nm. Further, it is necessary to control reflectance of the antireflection film structure 206 by regulating the film thickness of each of the first silicon oxide 207, the second silicon oxide 208 and the silicon nitride 209 corresponding to the wavelength of incident light. Based on the above fact, the thickness of the first silicon oxide 207 is set at about 16 nm, the thickness of the second silicon oxide 208 is set at about 150 nm, and the thickness of the silicon nitride 209 is set at about 50 nm. With this thickness of the antireflection film structure 206 and the impurity concentration of the second P type diffusion layer 204, the inversion voltage is about 7.7V. Therefore, even if positive charges are stored on the surface of the silicon nitride 209, inversion charges are not stored in a part of the P type semiconductor layer 202 between the two N type semiconductor layers 203 during a reliability test with a power supply voltage of about 6V. Further, even if carriers in the silicon nitride 209 is redistributed by Pool-Frenkel current, an inversion voltage specified by the total thickness of the first silicon oxide 207 and the second silicon oxide 208 and the impurity concentration of the second P type diffusion layer 204 is about 6.2V, so that the inversion charges are not stored in the part of the P type semiconductor layer 202 between the two N type semiconductor layers 203 during the reliability test with a power supply voltage of about 6V. Therefore, leak current is not generated between the N type semiconductor layers 203, i.e., between the cathodes. Also, the silicon nitride 209 is provided on the second silicon oxide 208, which makes it possible to reduce the reflectance of the antireflection film structure 206 to several %, thereby the split type light receiving device having excellent characteristics and sensitivity is obtained.

In the above embodiment, as long as leak current between cathodes immediately after production or during a reliability test is sufficiently restrained, the second P type diffusion layer 204 may have other concentration, or the second P type diffusion layer 204 may be deleted.

Further, in the above embodiment, it is acceptable to change P type to N type and N type to P type in the configuration. Moreover, the light receiving parts may adopt other forms. Furthermore, the power supply voltage of the light receiving device is not limited to the voltage value disclosed in the present embodiment.

Further in the above embodiment, although the second silicon oxide 208 is formed by CVD, it may be formed by any other methods as PVD, liquid-phase growth, vapor deposition and sputtering, except the thermal oxidation.

(The Third Embodiment)

Figure 4A:
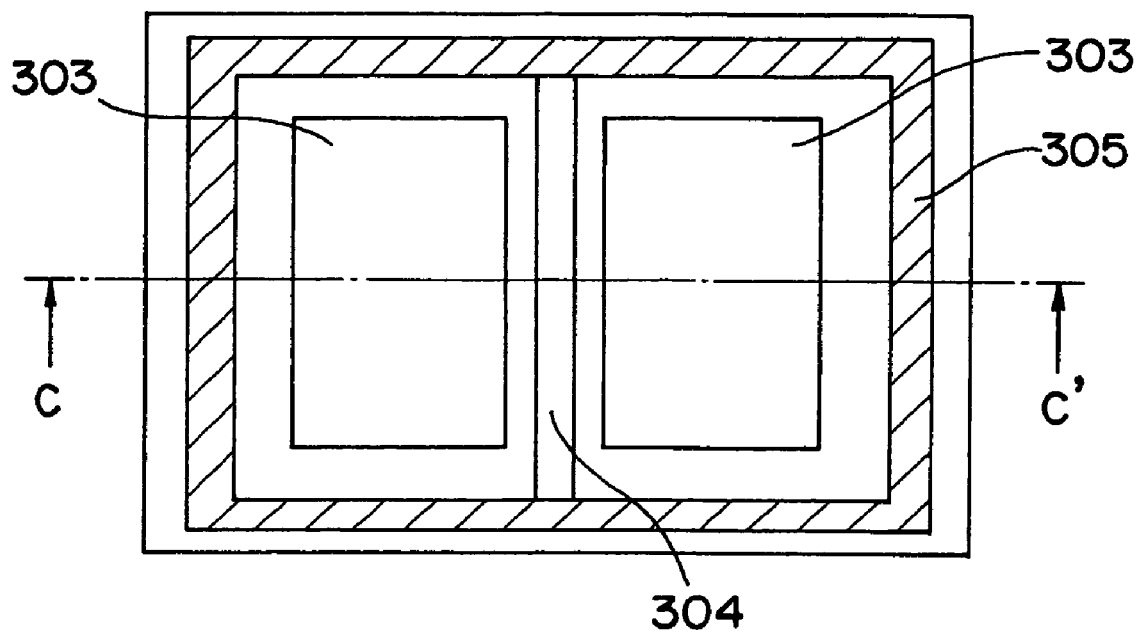
Figure 4B:
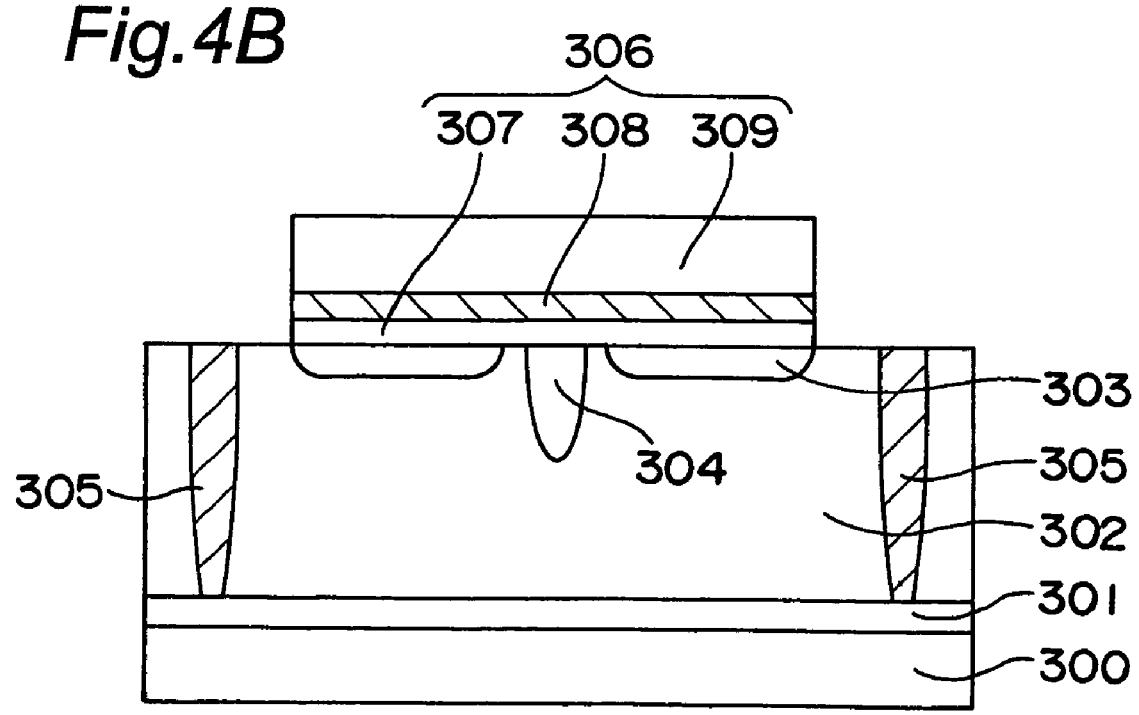
FIG. 4B is a cross sectional view taken along the arrow line C–C' of FIG. 4A.

FIG. 4A is a plan view showing a light receiving device in a third embodiment of the present invention, while FIG. 4B is a cross sectional view taken along the arrow line C–C' of FIG. 4A.

The light receiving device includes a silicon substrate 300, a first P type diffusion layer 301 with impurity concentration of about 1E18 $cm^{-3}$ and a thickness of about 1 μm on the silicon substrate 300, and a P type semiconductor layer 302 with impurity concentration of about 1E13 to 1E16 $cm^{-3}$ and a thickness of about 10 μm to 20 μm on the first P type diffusion layer 301. On the surface part of the P type semiconductor layer 302, two N type diffusion layers 303 and 303 with impurity concentration of about 1E17 to 1E20 $cm^{-3}$ in the vicinity of the top surface are formed to constitute light receiving parts. An impurity forming the N type diffusion layers 303 may be any element such as arsenic, phosphorus, and antimony as long as the element is pentavalent. It is to be noted that the number of the N type diffusion layers 303 may be two or more.

In the surface part of the P type semiconductor layer 302 and between the two N type diffusion layers 303 and 303, a second P type diffusion layer 304 is provided. Like the first and second embodiments, the second P type diffusion layer 304 has impurity concentration of about 1E17 $cm^{-3}$. Further, on the both left-hand and right-hand sides of the P type semiconductor layer 302 in FIG. 4B, there are shown parts of a third P type diffusion layer 305 extending from the top surface of the P type semiconductor layer 302 to the P type diffusion layer 301 for taking a contact. It is to be noted that impurities forming the first to the third P type diffusion layers 301, 304 and 305 may be any elements such as boron and indium as long as the elements are triatomic.

Further, on the P type semiconductor layer 302, and on the N type diffusion layers 303 as well as on a part between these two N type diffusion layers 303 and 303, there is provided an antireflection film structure 306. The antireflection film structure 306 is composed of a first silicon oxide 307, a silicon nitride 308, and a second silicon oxide 309, laminated in the order from the side closer to the light receiving parts. The first silicon oxide 307 is formed by thermal oxidation, whereas the second silicon oxide 309 is formed by CVD.

The total thickness of the antireflection film structure 306 should be set such that an inversion voltage specified by the total thickness and the impurity concentration of the second P type diffusion layer 304 is not smaller than the power supply voltage of the light receiving device. In the case where the power supply voltage is 6V, it is necessary to set the total film thickness at about 120 nm or larger. Particularly, the first silicon oxide 306 should preferably be as thin as possible, and the thickness thereof should preferably be not larger than 30 nm. Also, the silicon nitride 308 with a larger thickness increases the stress and therefore the thickness thereof should preferably be reduced to about 50 nm. Therefore, it is necessary to form the first silicon oxide 307 thinner than the second silicon oxide 309. More particularly, the film thickness of the first silicon oxide 307 is set at about 10 nm to 20 nm, the thickness of the silicon nitride 308 is set at about 10 nm to 30 nm, and the thickness of the second silicon oxide 309 is set at about 40 nm to 50 nm. In this case, an inversion voltage specified by impurity concentration of the P type semiconductor layer 302 and the total thickness of the antireflection film structure 306 is about 6 to 7V or larger. This makes it possible to effectively restrain leak current between cathodes conventionally generated after a power supply voltage is continuously applied for a long time. Also, the silicon nitride 308 is provided between the first silicon oxide 307 formed by thermal oxidation and the second silicon oxide 309 formed by CVD other than thermal oxidation, which makes it possible to alleviate the stress by the second silicon oxide 309 formed by CVD. Also, in the configuration disclosed in this embodiment, the second silicon oxide 309 is formed on the silicon nitride 308, so that almost no electric charges are stored in the silicon nitride 308 during the production process and in the wire bonding step. This allows effective prevention of leak current between light receiving parts caused by redistribution of electric charges generated in the silicon nitride during operation of the light receiving device as seen in the conventional case.

In the above embodiment, the thickness of the films constituting the antireflection film structure 306 may take various combinations as long as the inversion voltage is not smaller than a power supply voltage and the film thickness of the first silicon oxide 307 is not larger than 30 nm.

Further, the second silicon oxide 309 may be formed by any other methods as PVD, liquid-phase growth, vapor deposition and sputtering than CVD except the thermal oxidation.

(The Fourth Embodiment)

A light receiving device in the fourth embodiment of the present invention has the same components as the light receiving device in the third embodiment shown in FIGS. 4A and 4B except that the thickness of the antireflection film structure is different from that of the light receiving device in the third embodiment. In this embodiment, description will be given with reference numerals used in the light receiving device in the third embodiment.

In the light receiving device in this embodiment, each film constituting the antireflection film structure 306 is formed to have a thickness corresponding to the wavelength of light that comes incident to the light receiving device. More specifically, when the wavelength of the incident light to the light receiving device is 400 nm and the power supply voltage is 6V, the first silicon oxide 307 is formed to have a thickness of 16 nm, the silicon nitride 308 is formed to have a thickness of about 30 nm, and the second silicon oxide 308 is formed to have a thickness of about 140 nm. This makes it possible to reduce the reflectance of the entire antireflection film structure 306 to several percent. Also, an inversion voltage specified by each thickness of film constituting the antireflection film structure 306 and the impurity concentration of the second P type diffusion layer 304 is about 9V. Therefore, the light receiving device has an inversion voltage not smaller than the power supply voltage of 6V, so that even if the power supply voltage is continuously applied for a long time, leak current hardly flows between the cathodes. Therefore, the light receiving device of the present embodiment has a good signal characteristic that a power of incident light is efficiently converted to a signal, and is capable of preventing leak current for a long time and stably maintaining good characteristics.

(The Fifth Embodiment)

Figure 5:
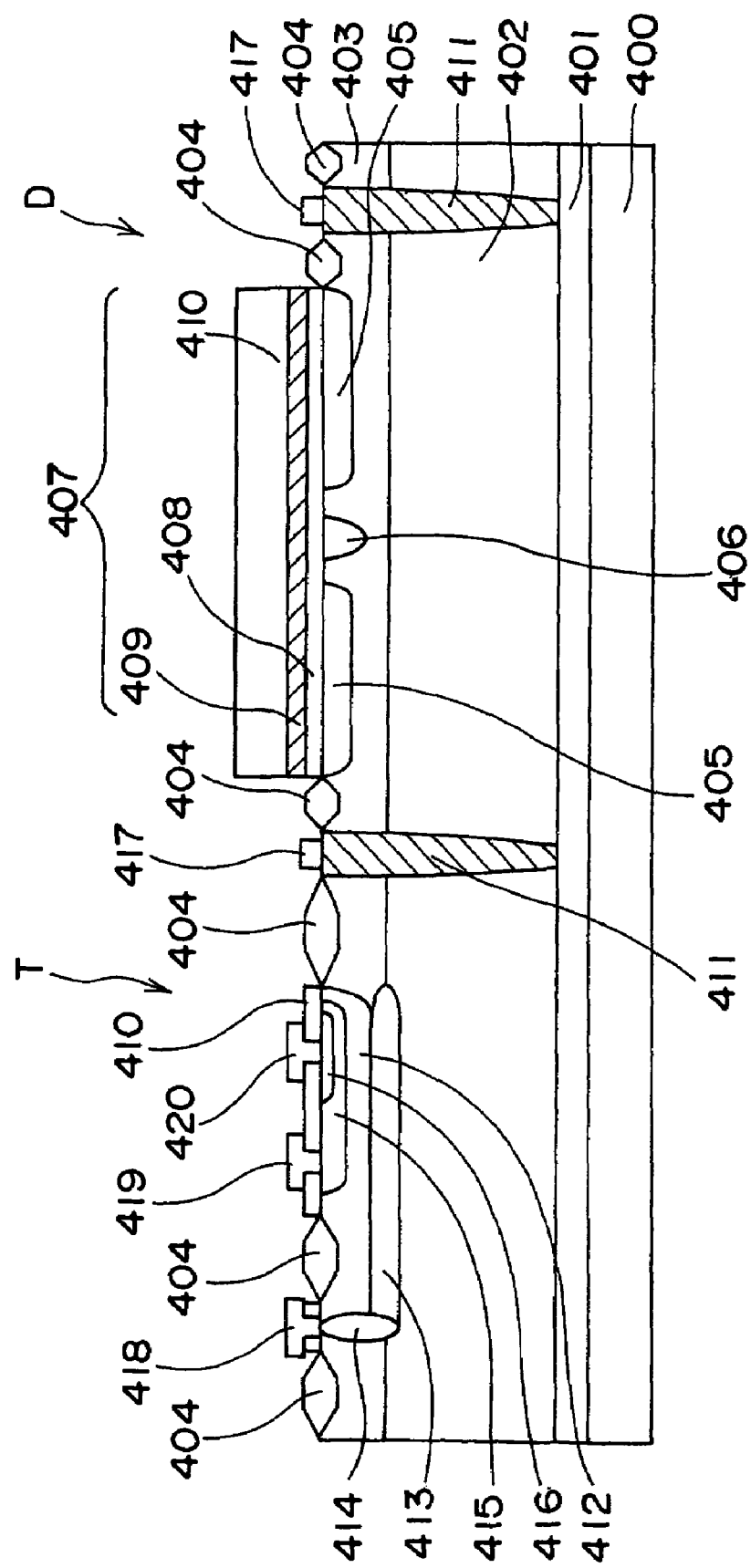
FIG. 5 is a cross sectional view showing a light receiving unit incorporating a circuit in a fifth embodiment of the present invention.

FIG. 5 is a cross sectional view showing a light receiving unit incorporating a circuit in a fifth embodiment of the present invention. The light receiving unit incorporating a circuit is composed of a light receiving device D having the same components as the light receiving device in the fourth embodiment and a bipolar transistor T as a signal processing circuit for processing a signal from the light receiving device D formed on the same semiconductor layer. In this embodiment, description of multilevel interconnections and interlayer films formed after the step for processing metal interconnections is deleted.

The light receiving unit incorporating a circuit has a silicon substrate 400 and a first P type diffusion layer 401 on the silicon substrate 400. The silicon substrate 400 has boron concentration of about $1E15$ cm$^{-3}$, meanwhile the first P type diffusion layer 401 has a thickness of 1 to 2 µm and boron concentration of about $1E18$ to $1E19$ cm$^{-3}$ for decreasing parasitic resistance against the anode of the light receiving device D. On the first P type diffusion layer 401, there is formed a first P type semiconductor layer 402 with thickness of 15 to 16 µm and boron concentration of about $1E13$ to $1E14$ cm$^{-3}$.

On the first P type semiconductor layer 402, there is formed a second semiconductor layer 403 with a thickness of 1 to 2 µm and boron concentration of about $1E13$ to $1E14$ cm$^{-3}$. LOCOS oxides 404, 404, ... are formed on the second P type semiconductor layer 403 for separating the element.

Further, on the surface part of the second P type semiconductor layer 403, there are formed two first N type diffusion layers 405 and 405 with phosphorus concentration of $1E19$ to $1E20$ cm$^{-3}$ and a junction depth of about 0.2 to 1.5 µm to form two light receiving parts. The N type diffusion layers 405 may be formed with use of pentavalent elements such as arsenic and antimony instead of phosphorus.

In the surface part of the P type semiconductor layer 402 and between these two first N type diffusion layers 405 and 405, a second P type diffusion layer 406 with impurity concentration of about $1E17$ cm$^{-3}$ is provided.

Further, on the second P type semiconductor layer 403, and on light receiving parts as well as on a part between these light receiving parts, there is provided an antireflection film structure 407 composed of a plurality of light transmitting films. Like the fourth embodiment, the antireflection film structure 407 is composed of a first silicon oxide 408 with a film thickness of 16 nm, a silicon nitride 409 with a film thickness of 30 nm, and a second silicon oxide 410 with a film thickness of 140 nm, laminated in the order from the side closer to the light receiving parts. The second silicon oxide 410 may be formed on the surface of the transistor T for serving as an interlayer film and/or a cover film for protecting the transistor.

Further, for forming an interconnection with the first P type diffusion layer 401 on the top surface of the second P type semiconductor layer 403, a third P type diffusion layer 411 with boron concentration of about $1E18$ to $1E19$ cm$^{-3}$ is formed so as to extend from the top surface of the second P type semiconductor layer 403 to the first P type diffusion layer 401.

Further, in a region of the second P type semiconductor layer 403 for forming the transistor T, an N type well structure 412 with phosphorus concentration of $1E17$ to $1E19$ cm$^{-3}$ is formed. Under the N type well structure 412, there is provided a second N type diffusion layer 413 with phosphorus concentration of about $1E18$ to $1E19$ cm$^{-3}$ for decreasing resistance of the N type well structure 412.

In part of the region of the N type well structure 412, there is formed a first N type semiconductor layer 414 with a phosphorus concentration of $1E19$ to $2E19$ cm$^{-3}$ as a collector contact of the transistor T. In other part of the region of the N type well structure 412, there are formed a third P type semiconductor layer 415 with boron concentration of $1E17$ to $1E19$ cm$^{-3}$ as a base of the transistor, and a second N type semiconductor layer 416 as an emitter formed with arsenic.

Further, there are formed a cathode electrode (unshown) connected to the first N type diffusion layers 405 and an anode electrode 417 connected to the third P type diffusion layer 411 of the light receiving device D. Further, there are formed a collector electrode 418, a base electrode 419 and an emitter electrode 420 of the transistor T. In the above-configured light receiving unit incorporating a circuit, the light receiving device D has the antireflection film structure 407 composed of the first silicon oxide 408, the silicon nitride 409 and the second silicon oxide 410. Further, the light receiving device D and the transistor T are formed on the same semiconductor substrate. Therefore, such a light receiving unit is obtained as small-size, having excellent sensitivity and signal characteristic, efficiently converting a power of incident light to a signal, and having a stable capability with leak current being prevented for a long time.

Further, the light receiving device D may be a light receiving device other than that in the fourth embodiment.

In the above embodiment, although the bipolar transistor T is an NPN transistor, it may be a PNP transistor or combination of the NPN type and PNP type transistors. Furthermore, without being limited to the bipolar transistor, the transistor may be other transistor such as MOS (Metal-Oxide-Semiconductor) transistor or BiCMOS (Bipolar CMOS) transistor, and further the transistor may be replaced by other signal processing circuit.

(The Sixth Embodiment)

Figure 6:
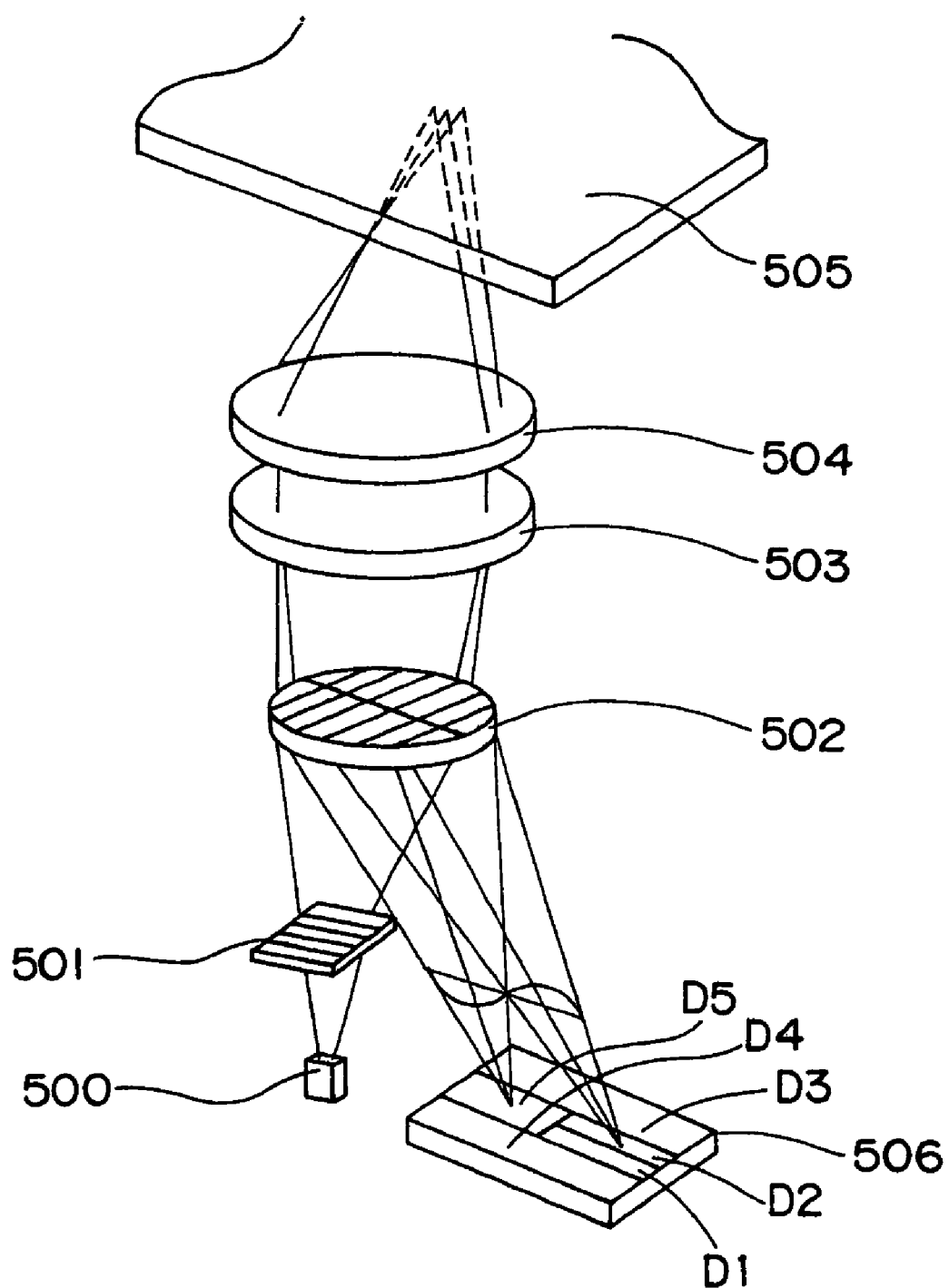
FIG. 6 is a view showing an optical pickup in an optical disk drive in a sixth embodiment of the present invention.
Figure 7A:
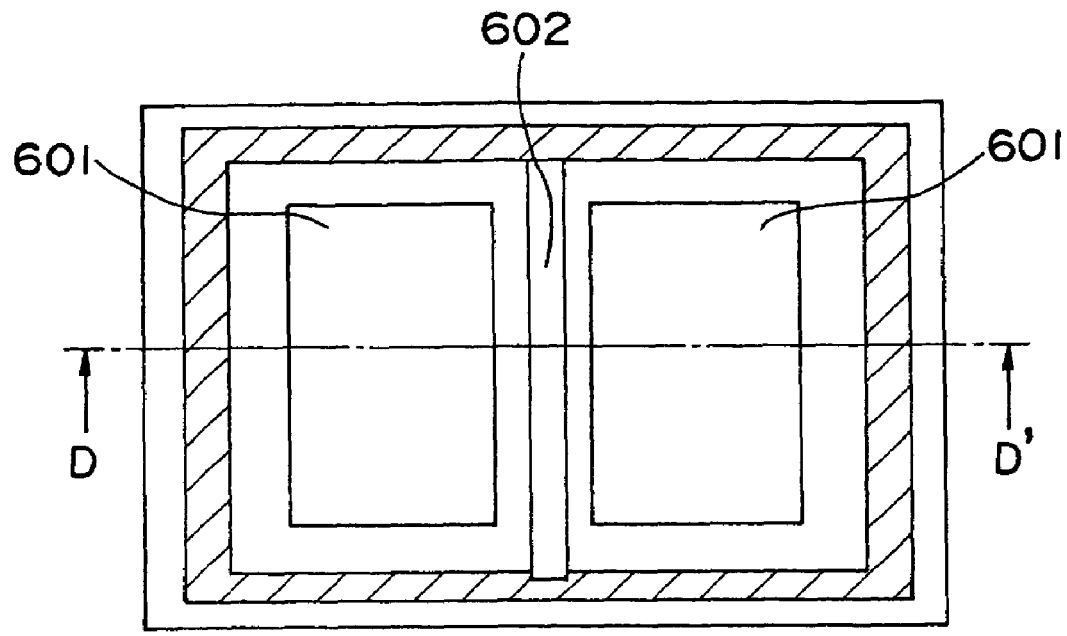
Figure 7B:
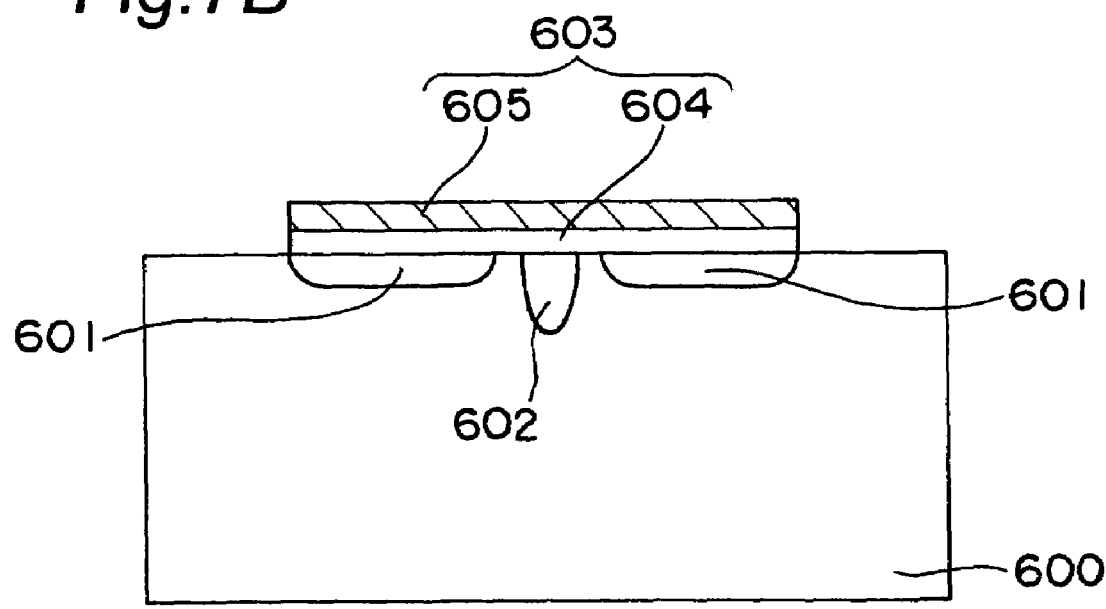
FIG. 7B is a cross sectional view taken along the arrow line D–D' of FIG. 7A.
Figure 8:
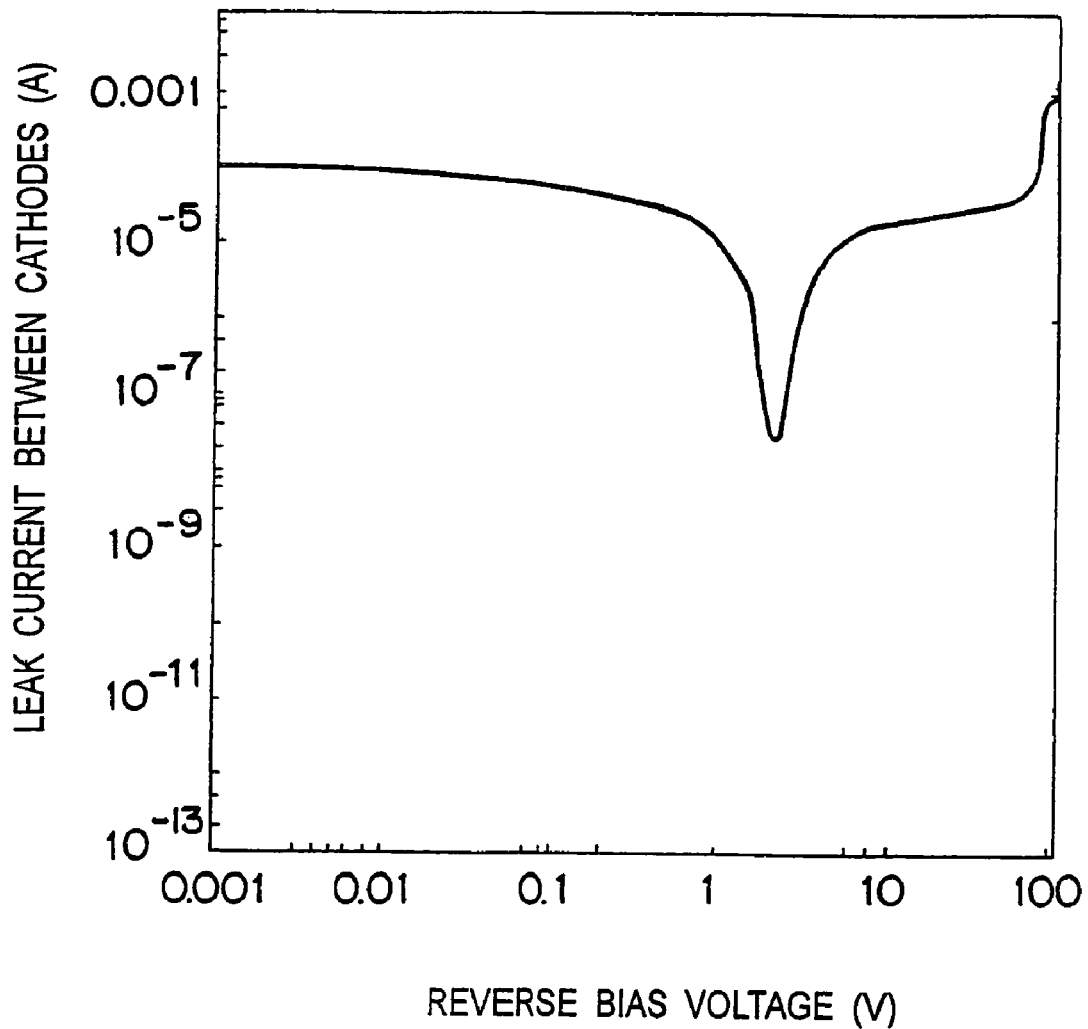
FIG. 8 is a graph showing changes in leak current between cathodes as a reverse bias voltage of the light receiving device is changed.
Figure 9:
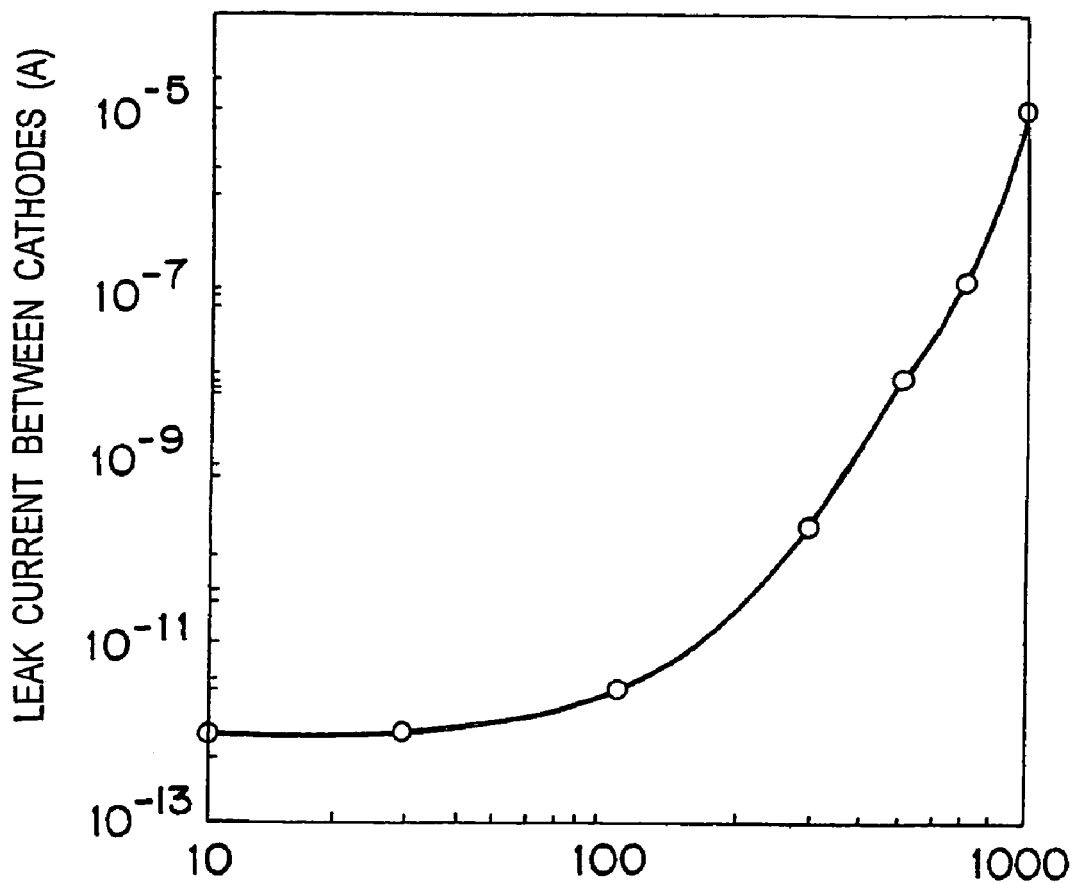
FIG. 9 is a graph showing changes in leak current between cathodes corresponding to the length of application time of a power supply voltage.
Figure 10:
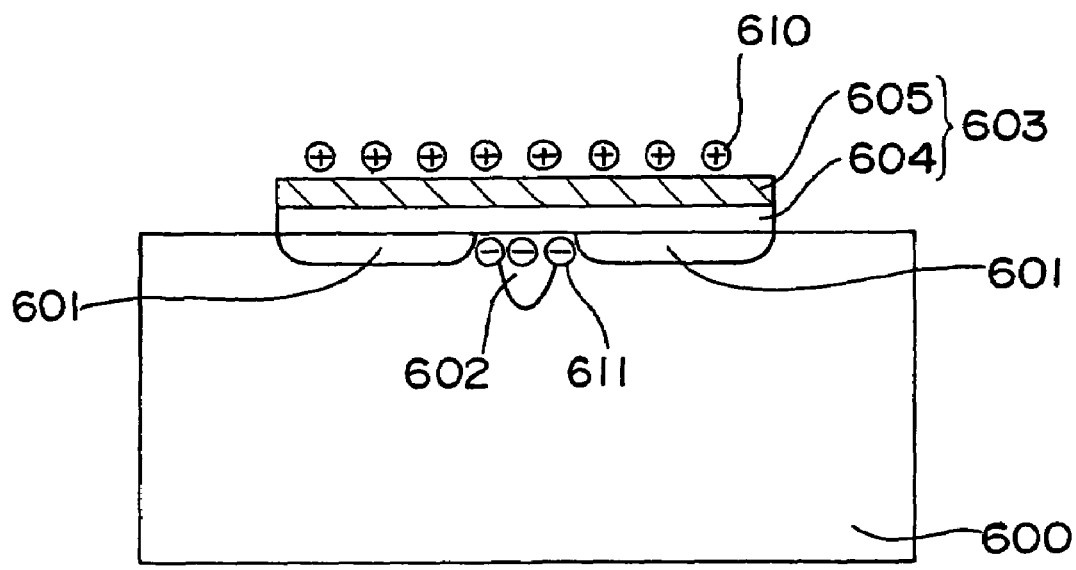
FIG. 10 is a schematic cross sectional view showing a conventional light receiving device after a longtime reliable test is carried out.
Figure 11A:
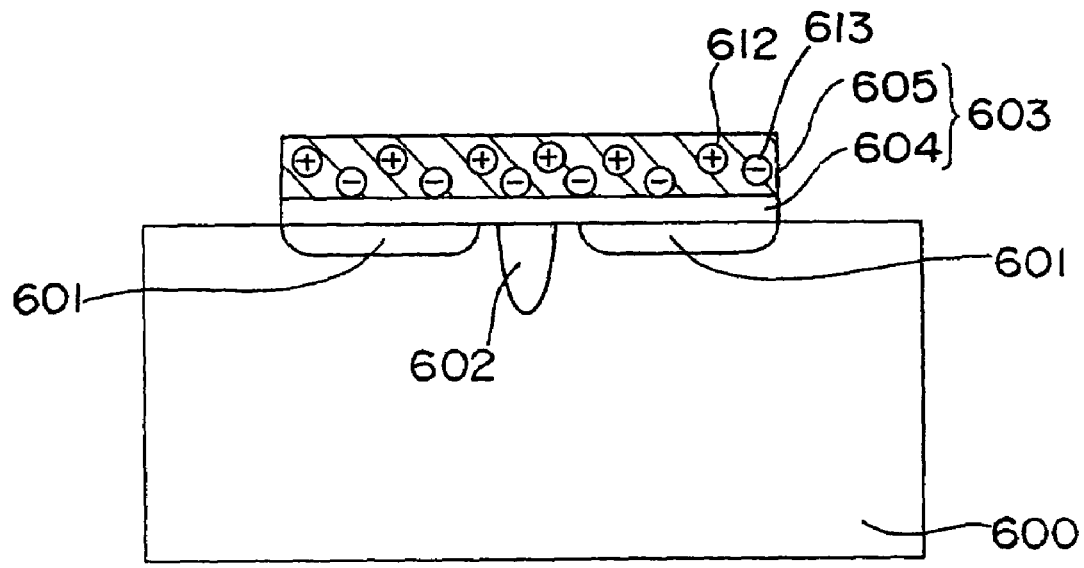
FIGS. 11A and 11B are views showing the conventional light receiving device with electric charges caused by Pool-Frenkel current being recombined during a reliability test, where
Figure 11B:
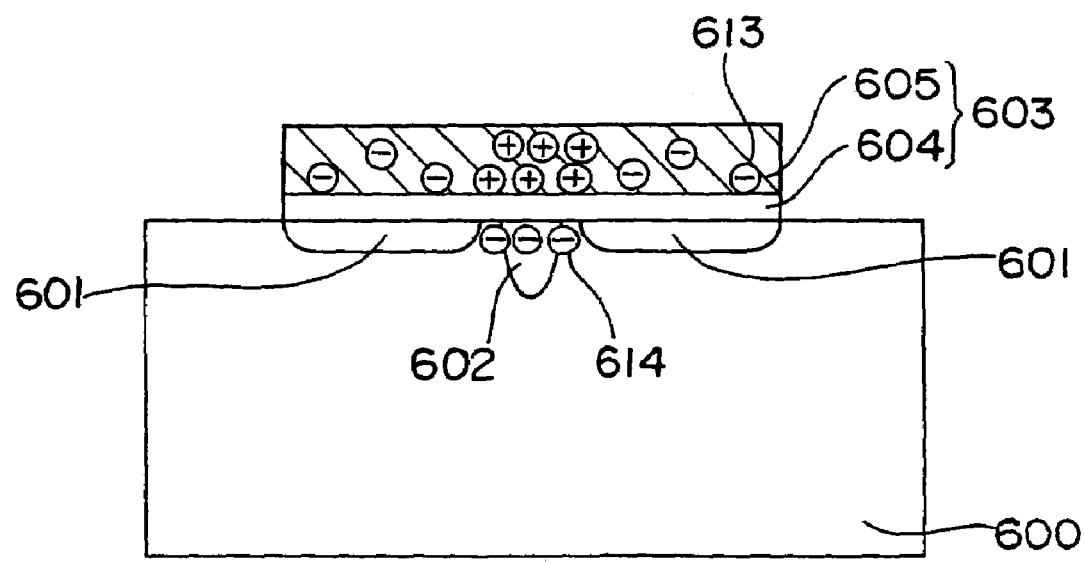

FIG. 6 is a view showing an optical pickup in an optical disk drive in a sixth embodiment of the present invention. The optical pickup includes the light receiving device 506 of the present invention having five light receiving parts from D1 to D5.

The optical pickup splits light from a semiconductor laser 500 into three beams, consisting of two side beams for tracking and one main beam for reading signals, with use of a diffraction grating 501 for generating tracking beams. These three beams are transmitted through a hologram element 502 as zero-order light, converted to parallel beams by a collimate lens 503, and collected on a disk 505 by an object lens 504.

The collected light is reflected with a light power being modulated by a pit formed on the disk 505. The reflected light transmits through the object lens 504 and the collimate lens 503, and is diffracted by the hologram element 502. A primary light from the hologram element 502 comes incident to a light receiving device 506 having five light receiving parts from D1 to D5. Then, by adding to and subtracting from each other among outputs from these five light receiving parts, a data signal and a tracking signal are obtained.

An optical disk drive having the above-configured optical pickup includes the light receiving device 506 capable of preventing leak current for a long time and having excellent sensitivity and signal characteristic. Therefore, it is attained that the optical disk drive is suitable for an optical disk for high-density storage such as DVD with use of light having short wavelength such as blue light.

In the above embodiment, the light receiving device 506 may be a light receiving unit incorporating a circuit of the present invention. This makes it possible to form a light receiving device and a circuit for processing a signal from the light receiving device on one chip, resulting in a small-size optical pickup and thereby a small-size optical disk drive.

Further, without being limited to the optical pickup system in the above embodiment, the present invention may use other optical systems.

The invention claimed is:

1. A light receiving device for receiving light of a substantially single wavelength, comprising:
    a plurality of light receiving parts on a semiconductor layer; and
    a first light transmitting film and a second light transmitting film which are laminated at least on the plurality of light receiving parts and on parts between the plurality of light receiving parts in an order from a side closer to the light receiving parts, wherein
    both the first light transmitting film and the second light transmitting film are oxides, and
    the second light transmitting film is larger in thickness than the first light transmitting film, wherein each respective thickness is based on the wavelength of said light, wherein
    the first light transmitting film is a silicon oxide formed by thermal oxidation method, and
    the second light transmitting film is a silicon oxide formed by deposition method, and
    wherein an oxygen concentration in the second light transmitting film is lower than in the first light transmitting film.

2. The light receiving device as defined in claim 1, further comprising
    a third light transmitting film disposed between the first light transmitting film and the second light transmitting film.

3. The light receiving device as defined in claim 2, wherein
    the third light transmitting film is a silicon nitride.

4. A light receiving unit incorporating a circuit comprising:
    the light receiving device as defined in claim 1; and
    a signal processing circuit for processing a signal from light receiving parts of the light receiving device, wherein
    the light receiving device and the signal processing circuit are formed on the semiconductor layer.

5. An optical disk drive comprising the light receiving device as defined in claim 1.

6. An optical disk drive comprising the light receiving unit incorporating a circuit as defined in claim 4.

7. A light receiving device comprising:
    a plurality of light receiving parts on a semiconductor layer; and
    a first light transmitting film and a second light transmitting film which are laminated at least on the plurality of light receiving parts and on parts between the plurality of light receiving parts in an order from a side closer to the light receiving parts, wherein
    both the first light transmitting film and the second light transmitting film are oxides,
    an oxygen concentration of the first light transmitting film and an oxygen concentration of the second light transmitting film are different from each other, and
    the second light transmitting film is larger in thickness than the first light transmitting film.

* * * * *